United States Patent [19]

Murphy

[11] Patent Number: 5,012,924

[45] Date of Patent: May 7, 1991

[54] CARRIERS FOR INTEGRATED CIRCUITS AND THE LIKE

[75] Inventor: Robert H. Murphy, Merrimack, N.H.

[73] Assignee: R. H. Murphy Company, Inc., Amherst, N.H.

[21] Appl. No.: 495,860

[22] Filed: Mar. 19, 1990

[51] Int. Cl.⁵ .................. B65D 73/02; H05F 3/00; H01H 47/00

[52] U.S. Cl. ...................................... 206/331; 361/220

[58] Field of Search ............... 206/328, 329, 331, 334; 361/220

[56] References Cited

U.S. PATENT DOCUMENTS

| | | | |
|---|---|---|---|
| 3,653,498 | 4/1972 | Kisor | 206/331 |
| 3,746,157 | 7/1973 | I'Anson | 206/331 X |
| 4,026,412 | 5/1977 | Henson | 206/331 |
| 4,549,651 | 10/1985 | Alemanni | 206/331 |
| 4,677,520 | 6/1987 | Price | 206/331 X |
| 4,706,161 | 11/1987 | Buckingham | 206/331 X |
| 4,725,918 | 2/1988 | Bakker | 206/331 X |
| 4,765,471 | 8/1988 | Murphy | 206/331 X |

*Primary Examiner*—William I. Price
*Attorney, Agent, or Firm*—Pearson & Pearson

[57] ABSTRACT

A carrier adapted for diverse electrical and electronic components to facilitate shipping, handling and testing of these components. The carrier comprises a conductive frame and an insulative insert. The insulative insert electrically isolates each terminal lead of the component from other terminal leads as well as from all conductive material. The conductive frame abuts additional surfaces of the insulative insert, as well as forming most external surfaces of the carrier structure, thereby dissipating any electrostatic charges that can accumulate.

24 Claims, 9 Drawing Sheets

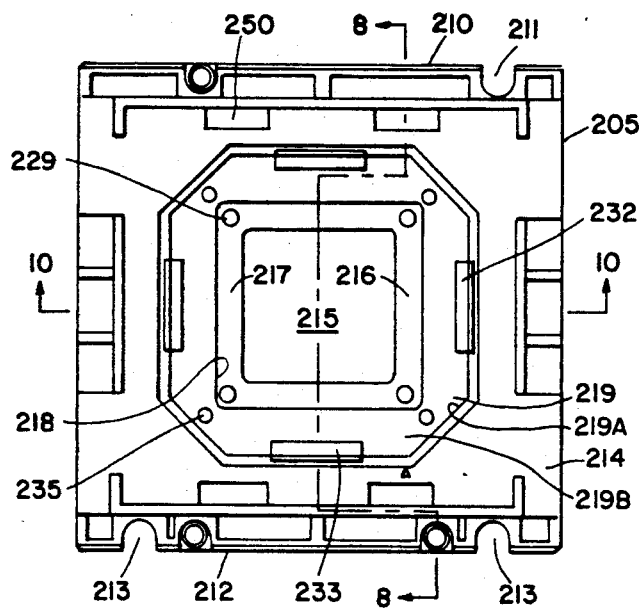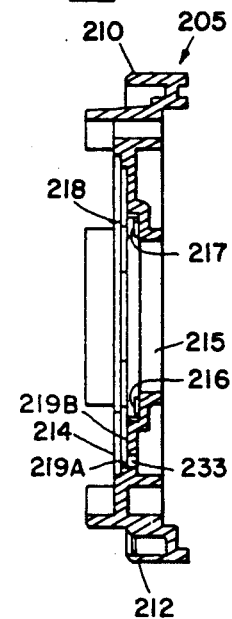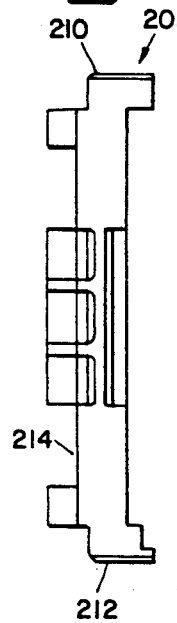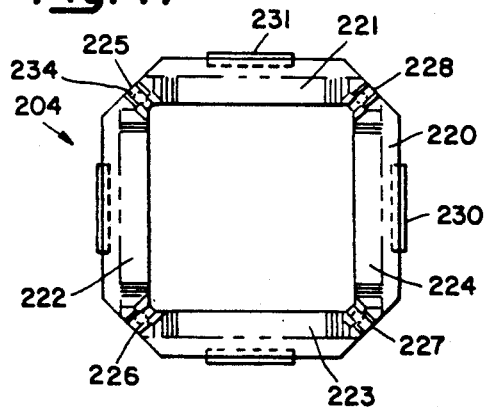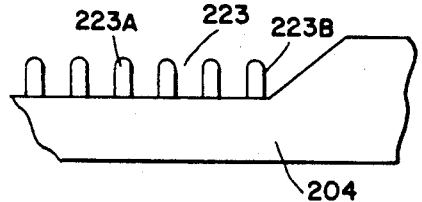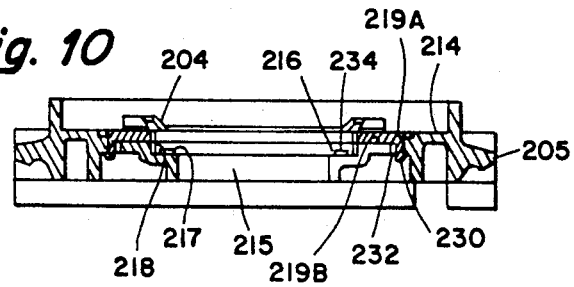

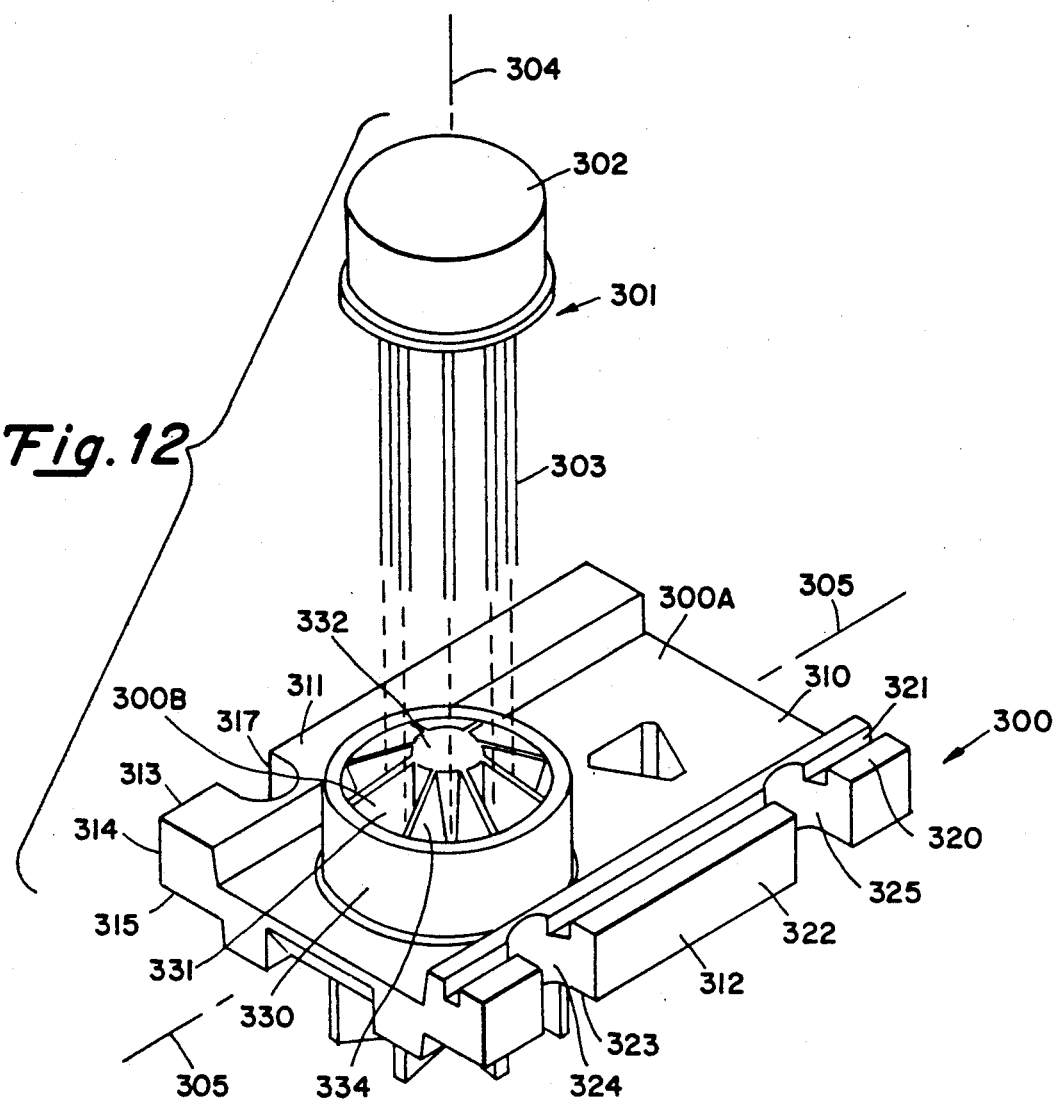
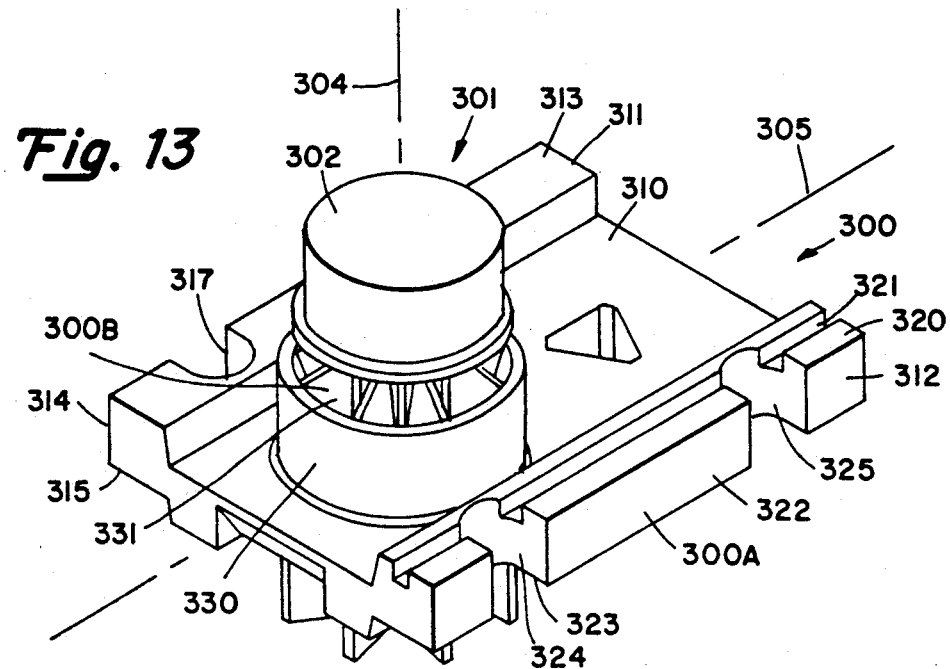

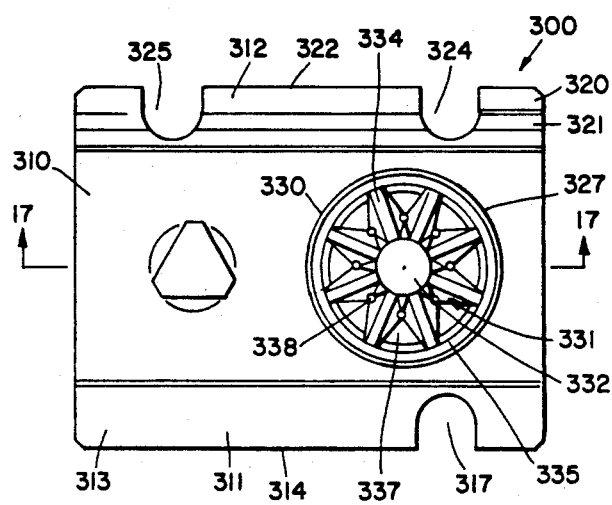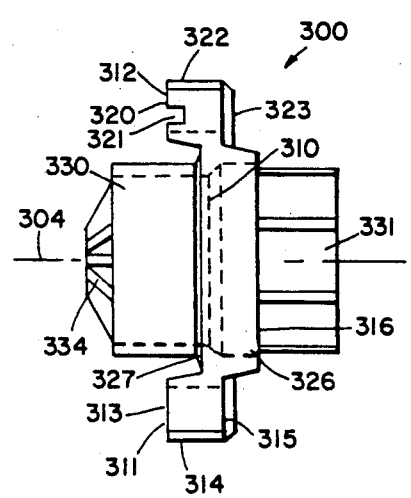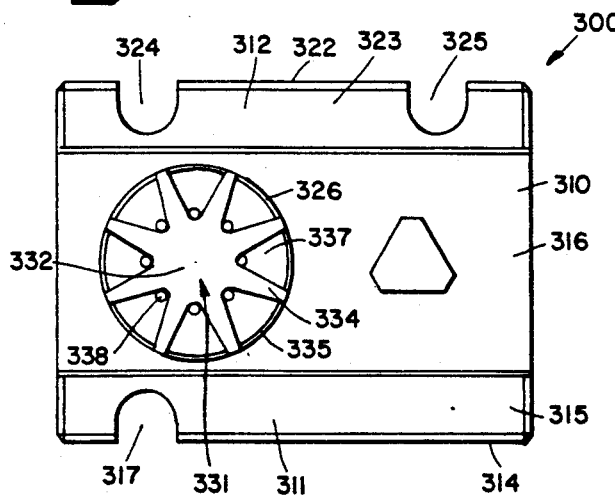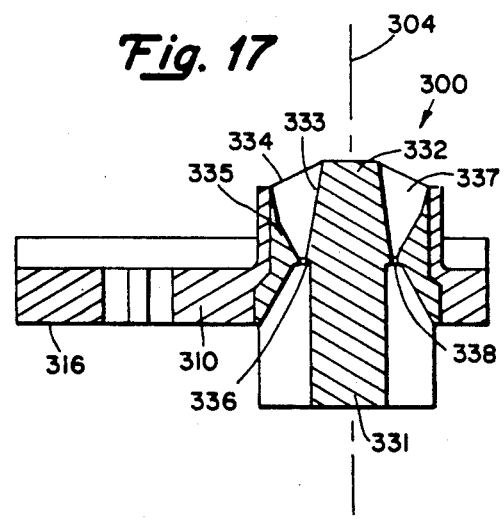

CARRIERS FOR INTEGRATED CIRCUITS AND THE LIKE

BACKGROUND OF THE INVENTION

1. Field of the Invention

This invention generally relates to carriers for integrated circuits and the like and more specifically to such carriers that, during manufacture and assembly operations position such circuits, protect them from mechanical and electrical damage and facilitate their testing.

2. Description of Related Art

Semiconductor devices have matured from simple circuit elements into complex components, and this maturation has been accompanied by an increase in the complexity of handling these components during assembly and testing operations. For example, simple, discrete components such as transistors, diodes and the like, either were soldered directly into a circuit or were held in component sockets to facilitate replacement. With the advent of more sophisticated assembly equipment and procedures, it became advantageous to position these devices mechanically and then to solder groups of terminals associated with plural components to a circuit board during a single soldering operation. When these circuit boards failed, it was still possible to replace individual components because the replacement procedures were straightforward as each component had only a few terminals that could be cut and removed.

With current technology, semiconductor devices include expensive integrated circuits and like components with a large number of terminals These integrated circuits often are located on multiple layer circuit boards. They have become subject to damage from a number of external influences such as mechanical shock and discharges of accumulated electrostatic charge. Thus, the procedures for handling such components are critical Moreover, the increased density of such components on circuit boards and their costs have led to the development of component testing prior to assembly. These procedures are also necessary because in many situations it no longer is economically feasible to replace defective components. Often an entire circuit board with a number of valuable integrated circuits may be discarded even if a single component on the board fails.

The need to protect integrated circuits and test them individually led to the advent of chip carriers. Chip carriers are special enclosures or packages that house an integrated circuit or the like during processing, production, testing and assembly operations. More specifically, a typical chip carrier orients an integrated circuit during the production process, assures proper placement and alignment of terminals for testing and for insertion into a printed circuit board. They eliminate stresses from the terminals and seals in such integrated circuits. More recently, chip carriers have been constructed to dissipate electrostatic charges that otherwise can accumulate on a component. There are several general approaches to the chip carrier design that seek to provide these various functions.

In accordance with one general approach, a carrier body supports an integrated circuit. An electrical shorting mechanism or insert contacts all the terminals to dissipate any electrostatic charge. Other mechanisms displace the shorting bar or insert from the terminals during testing operations. The following U.S. Letters Patent depict various specific embodiments that incorporate this general approach.

U.S. Pat. No. 3,653,498 (1972) Kisor
U.S. Pat. No. 3,746,157 (1973) l'Anson
U.S. Pat. No. 4,026,412 (1977) Henson
U.S. Pat. No. 4,549,651 (1985) Alemanni
U.S. Pat. No. 4,677,520 (1987) Price
U.S. Pat. No. 4,706,161 (1987) Buckingham
U.S. Pat. No. 4,725,918 (1988) Bakker Kisor discloses a carrier formed of a carbon-embedded plastic with a shorting member that contacts all the terminals. The shorting member must be removed prior to testing. L'Anson discloses an analogous structure with a shorting member that falls away from the terminals during testing. Buckingham discloses a shorting bar held across accessible terminals; the bar is withdrawn for testing. Bakker discloses a chip carrier with an insert that avoids electrostatic discharges; the insert must be removed before testing occurs.

An insulating base member in Henson supports an integrated circuit housing on a metallic heat sink; a cover overlies the housing The insulting base member supports extensions of the terminals that extend beyond the cover. Alemanni discloses a carrier for a pin grid array circuit with a base member having a plurality of apertures formed through removable carrier inserts to adapt the carrier to a variety of packages. Neither Henson nor Alemanni discusses problems associated with the accumulation of electrostatic charges. Price discloses a device that protects a component from electrostatic discharges by positioning the device in an ionizable gas.

U.S. Pat. No. 4,765,471 of Robert Murphy, that is titled Electrical Component Carrier and assigned to the same assignee as the present invention, discloses a chip carrier that performs a number of desirable functions without the need for shorting bars, inserts or related apparatus as shown in the foregoing references. In accordance with this patent, a plate assembly, comprising an insulating plate sandwiched between two conductive plates, supports a pin grid array (PGA) component. Apertures through all the plates receive the integrated circuit terminals, these apertures being in register through the plate assembly. The diameter of each aperture in the insulating plate is less than the corresponding diameters in the conductive plates, so plate assembly electrically isolates each terminal, but enables access to each terminal for testing below the plate assembly. A conductive cover overlies and retains the component in the carrier in a fixed position. Peripheral skirts or walls that circumscribe e plate assembly protect the component and its terminals from mechanical damage. The existence of conductive surfaces covering all the insulating materials prevents the accumulation of electrostatic charge.

When components are handled without any electrostatic protection, discharges of several thousands of volts can occur. The structure disclosed in the foregoing U.S. Pat. No. 4,765,471 limits and even eliminates electrostatic discharges. Although such protection necessary for a number of integrated circuits and other components, it has been determined that a class of components, including integrated circuits, exist that can withstand discharges of hundreds of volts. For components in this class, it was difficult to justify the additional manufacturing costs associated with extensively covering all insulating portions of a chip carrier with a conductive material. Moreover, structures such as shown in U.S. Pat. No. 4,765,471, seem limited to use with a single package style, such as a pin grid array (PGA) package. The application of such approaches to other package types, such as flatpack and transistor outline packages was not clearly evident.

SUMMARY

Therefore, it is an object of this invention to provide a common chip carrier structure that limits electrostatic charges for divers electronic components to acceptable levels.

Another object of this invention is to provide a common chip carrier structure that limits electrostatic charges for divers electronic components to acceptable levels and that is adapted to be incorporated in chip carriers for a range of packages for integrated circuits and other components.

Still another object of this invention to provide a chip carrier structure that limits electrostatic charges to acceptable levels for a range of electronic components in different packages and that protects the terminals and packages from mechanical damage.

Still yet another object of this invention to provide a chip carrier structure that limits electrostatic charges to acceptable levels for a range of electronic components in different packaging structures and that facilitates testing a component while it is supported in the chip carrier.

In accordance with this invention, a chip carrier comprises a conductive frame means that circumscribes an electronic component in a least one plane. An insulating means attached to the conductive frame means includes supporting surfaces that position the component and each terminal in electrical isolation so external equipment can readily test the component. The conductive frame means includes portions that overlie insulating surfaces other than the supporting and isolating surfaces.

BRIEF DESCRIPTION OF THE DRAWINGS

This invention is pointed out with particularity in the appended claims. The various objects, advantages and novel features of this invention will be more fully apparent from a reading of the following detailed description in conjunction with the accompanying drawings in which like reference numerals refer to like parts, and in which:

FIG. 7 is a top view of the carrier shown in FIGS. 5 and 6;

FIG. 8 is a section view of the carrier taken along lines 8—8 in FIG. 7;

FIG. 9 is a side view of the carrier shown in FIGS. 5 and 6;

FIG. 10 is a section view taken along line 10—10 in FIG. 7;

FIG. 11 is a top view depicting an insert for the carrier shown in FIGS. 5 and 6;

FIG. 11A is an enlarged detail in cross-section of a portion of the insert shown in FIG. 11;

FIG. 12 is an exploded perspective view of a transistor outline integrated circuit package and a chip carrier for that package constructed in accordance with this invention;

FIG. 13 is a perspective view of the elements shown in FIG. 12 in an assembled fashion;

FIG. 14 is a top view of the chip carrier shown in FIGS. 12 and 13;

FIG. 15 is side view of the chip carrier shown in FIGS. 12 and 13;

FIG. 16 is a bottom view of the chip carrier shown in FIGS. 12 and 13;

FIG. 17 is a cross-section taken along lines 17—17 in FIG. 14;

DESCRIPTION OF ILLUSTRATIVE EMBODIMENTS

The following description discloses specific embodiments of chip carriers adapted for (1) pin grid array (PGA) circuits, (2) flatpack circuits, (3) eight-terminal transistor outline (TO) circuits and (4) twelve-terminal TO circuits. These specific embodiments will demonstrate the application of the general structure of this invention to carriers for other circuit components.

PIN GRID ARRAY CIRCUIT CARRIER

Figure 1:
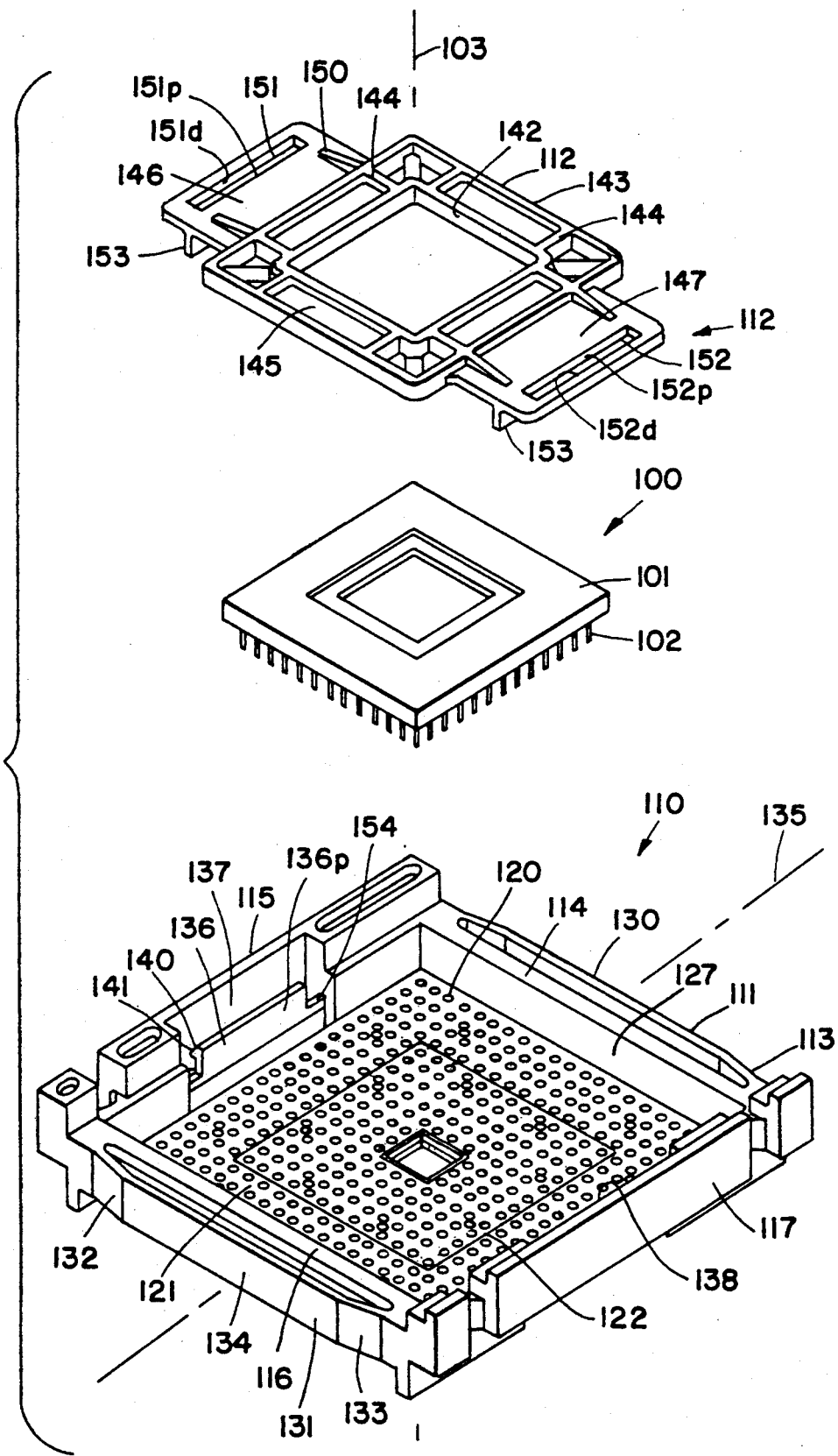
FIG. 1 is an exploded view in perspective of a pin grid array integrated circuit and a chip carrier for that integrated circuit constructed in accordance with this invention.
Figure 2:
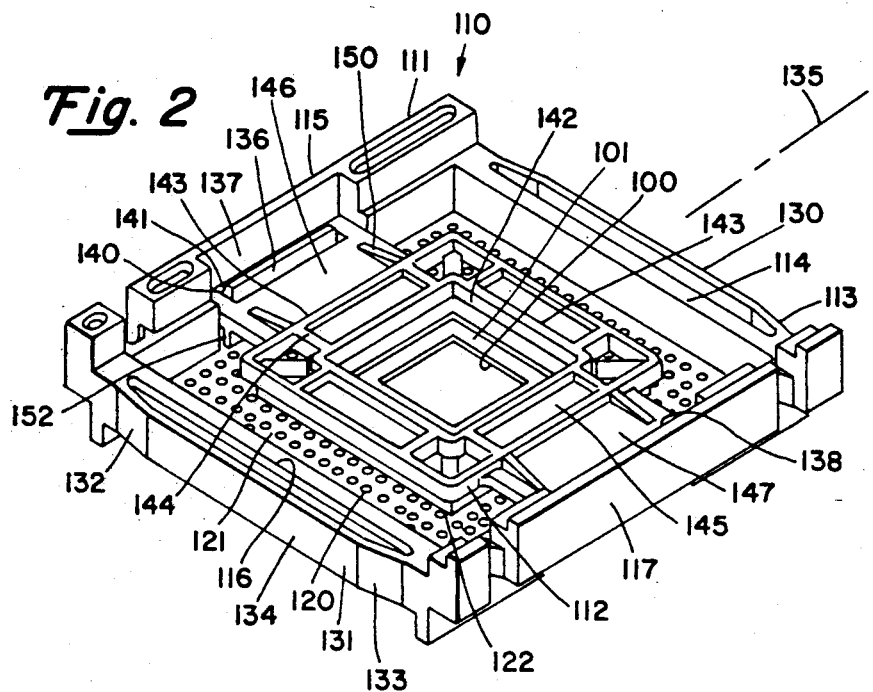
FIG. 2 is a perspective view of the assembly shown in FIG. 1 with the elements connected together as would appear during normal assembly procedures.

FIGS. 1 through 4 disclose a chip carrier incorporating this invention that is useful in connection with the transportation, handling and testing of pin grid array (PGA) integrated circuits 100. As shown in FIGS. 1 and 2, a PGA integrated circuits typically comprise a ceramic planar square housing 101. A plurality of terminals 102 depend from the planar body portion 101. As shown in FIG. 1 the PGA integrated circuit 100 is centrally disposed of and normal to an axis 103. As this invention is useful with a number of similarly formed components such as other circuit elements that are formed in the so-called PGA packages and with circuits that could also have a rectangular or square shape, the phrase "PGA component" is used in this description to include all such devices. They are devices that are characterized by a rectangular planar body portion and depending terminal portions in a predetermined array.

The PGA carrier of this invention includes a chip carrier assembly 110 having a carrier frame 111 and a removable retaining means or cover 112. The carrier frame 111 comprises an outer or peripheral rectangular conductive frame 113 having four walls or skirts 114 through 117. A planar insulating plate 120 with an upper surface 121 and a plurality of apertures therethrough positions and supports the housing 101. As more specifically shown in FIGS. 1 through 4, the insulating plate 120 includes a plurality of apertures 122 therethrough having an inner surface 123. The insulating plate 120 additionally includes a bottom surface 124 and peripheral or edge surfaces 125 The bottom surface 124 of the insulating plate 120 lies on a conductive plate 126 that is formed integrally with the conductor frame 113.

Figure 4:
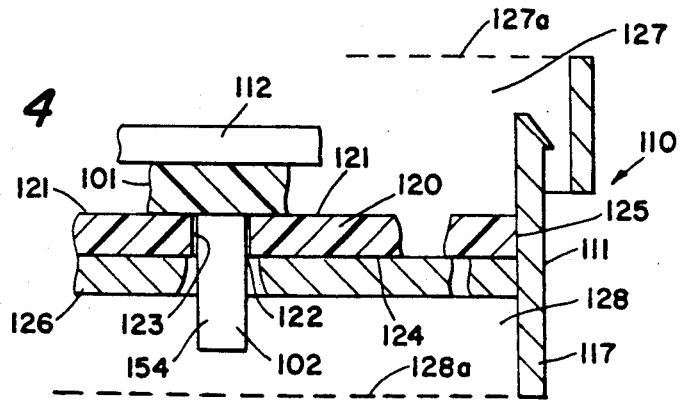
FIG. 4 is a detailed cross-section of a portion of a plate assembly shown in FIG. 3.

As shown more specifically in FIG. 4, the conductive plate portion 126 is integrally formed with the side walls or skirts such as the skirt 117 shown in FIG. 4 and is located about midway along the skirt and along the axis 103. This positioning of the plates 120 and 126 with the walls, such as skirt 117 shown in FIG. 4, defines an upper cavity 127 and a lower cavity 128 in which the integrated circuit is positioned. Dashed lines 127a and 128a denote the extent of the cavities 127 and 128, respectively. The cavity 127 protects the integrated circuit housing 101 from damage; the lower cavity 128 minimizes potential damage to the terminals 102.

Figure 3:
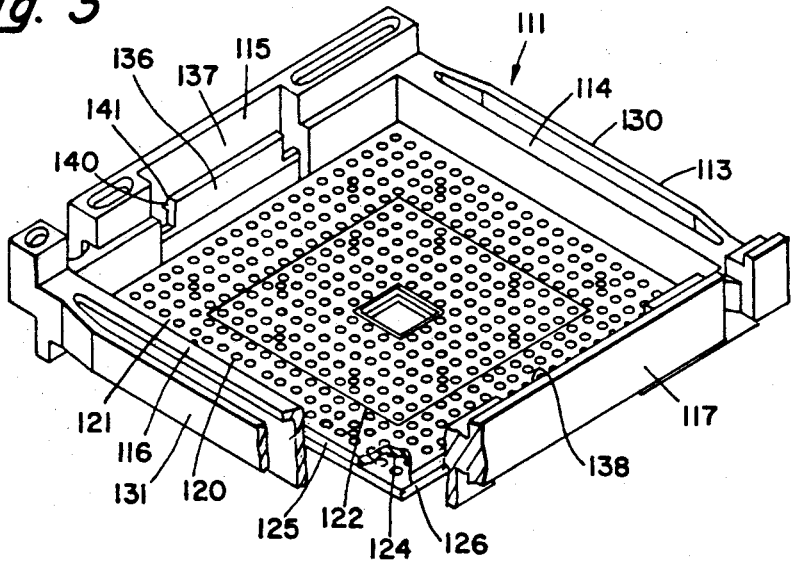
FIG. 3 is a perspective view of a portion of the chip carrier shown in FIGS. 1 and 2 in partial sections.

FIGS. 1 through 3 also depict an addition to the basic carrier frame that can improve mechanical protection for PGA components when it is anticipated that they will undergo shock. More specifically, as shown in FIGS. 1 through 3 bumpers 130 and 131 are spaced from and lie outside walls 114 and 116. They have similar construction. By way of example, bumper 131 comprises offsetting end portions 132 and 133 and a central portion 134, as specifically shown in FIGS. 1 and 2. The offsetting end portions 132 and 133 are short with respect to the central portion 134 and provide a space between the bumper 131 and the wall 116. An axis 135 represents a typical motion axis That is, a chip carrier assembly 110 as shown in FIGS. 1 and 2 normally travels along a path corresponding to the axis 135. Shocks are likely to be imparted along the axis 135, particularly as one chip carrier assembly 110 strikes another during transport or handling. Any impact along an axis 135 flexes the bumpers 130 and 131. This dissipates energy imparted through the shock and minimizes any transfer of that shock to the PGA component 100 in the carrier frame 111. The bumpers 130 and 131 are, however, optional. That is, a chip carrier assembly may have a single bumper, such as bumper 130, double bumpers or no bumpers.

The component retaining means in the form of the cover 112 locks to the carrier frame 111 through the interaction of first engagement means on the carrier frame 111 and second engagement means on the cover 112 as shown in FIGS. 1 and 2. Referring first to the carrier frame 111, an upstanding arm 136 forms the first engagement means and lies centrally along the wall 115 in a gap 137 such that a central portion of the wall 115 lies to the exterior of the upstanding arm 136 and protects it from manipulation by external sources. A similar structure exists in a gap 138 with respect to wall 117, although it is not shown in the perspectives of FIGS. 1 and 2. The operation of the first and second engagement means are described in greater detail later. At this point it is sufficient to understand that the upstanding arm contains an upper or camming head portion 140 with an oblique surface 141 to the exterior side. With respect to the axis 135, the upstanding arm 136 has a proximal surface 136p.

Still referring to FIGS. 1 and 2, the cover 112 comprises an inner square frame 142 and an outer frame 143 interconnected by a series of transverse struts or ribs 144. The area between the frames 142 and 143 may also be filled by stabilizing closure panels. Latching extensions 146 and 147 cantilever from the outer frame 112; extensions 150 of the certain ribs 144 stabilize these extensions 146 and 147. Latching extensions contain rectangular slots 151 and 152, respectively that are sized to approximate the outline projection of the upstanding arms 136 in a plane parallel to the plate 120. Further, proximal surfaces 151p and 152p with respect to the axis 135 are spaced by a distance less than the distance between the proximal surface 136p and the corresponding surface on the other upstanding arm associated with the wall 117. The distance between distal surfaces 151d and 152d on the slots 151 and 152 is less than the distance between the oblique surface 141 on the upstanding arm 136 attached to the wall 115 and the corresponding surface associated with the arm in the gap 138 of the wall 117.

The cover 112 also comprises two depending legs 153 extending from the latching extensions 146 and 147. These provide spacing for PGA components 100 that have greater than a predetermined thickness. For thin PGA components 100, the cover 112 is merely inverted and the rib section is positioned in contact with the PGA component. Typically the underside or bottom of the cover 112, as shown in FIG. 1, is a smooth planar surface.

During installation the PGA component 100 is positioned centrally on the plate 120 with the terminals 102 passing through the various apertures 122. As the cover 112 moves into position, it first engages the slot 137 formed in the wall 115 and a corresponding slot 138 at the wall 117. These slots 137 and 138 guide the cover 203 to a position where it lies on the upstanding arm 136 at wall 115 and a corresponding arm at the wall 117. The relative spacings of the slots and arms prevent the cover 112 from additional movement. With downward pressure on the cover 112 the distal surfaces 151d and 152d engage the oblique surface 141 and the corresponding surface on the cam at the wall 117 thereby to deflect the arm 136 and the corresponding opposite arm toward the axis 135 until the cover 112 slides over the oblique surfaces, including oblique surface 141. The lower portion of the oblique surface 141 lies above the upper surface of the latching extensions 146 so the arm 136 relaxes. The lower portion of the oblique surface 141 then overlies a portion of the latching extensions 146 and locks the cover 112 into place. A similar action occurs at the wall 117. Thus the cover 112 and the carrier frame 111 capture the PGA component 100 in a positive manner. Moreover, as normal motion of the carrier assembly 110 is transverse to an axis through the latching extensions 146 and 147, any mechanical shocks imparted to the carrier along the axis 135 will not deflect the arm 136 or the corresponding arm at the wall 117 and inadvertently unlatch and release of the cover 112.

A removal tool, that forms no part of the invention, has upstanding fingers that engage outer surfaces of the arms, such as arm 136. This tool forces the arms toward the center (i.e., toward the axis 135 until the camming head portion 140 aligns with the slot 151 and the other camming head portion aligns with the slot 152. Then the tool elevates the cover 112 above the arm 136 so the cover 112 can be removed.

Referring to FIG. 4, there is shown a partial cross-section including the wall 117, the conductive plate 126 extending from the wall 117, and the insulating plate 120 with a bottom surface 124 in contact with the upper surface of the conductive plate 126. The cover 112 captures the housing 101 against the insulating portion 120. The aperture 122 through the insulating material 120 has a diameter that is less than the corresponding diameter of the aperture 123 through the plate 126. As a result the aperture 122 centers the terminal 102 on the apertures 122 and 123 and isolates the terminals 102 from the conductive plate 126.

In accordance with this invention, the carrier 110 shown in FIGS. 1 through 4 includes an insulating means in the form of a insulating plate 120 and a conductive frame means 111. A first or upper surface 121 positions and supports the component in the carrier and the aperture surfaces 123 through the insulating plate 120 define second surfaces that support each terminal 102 in electrical isolation. The conductive frame means 111 includes a rectangular square boundary means defined by the skirts 114 through 117 that circumscribe the insulating plate 120. The side walls 114 through 117 abut the edges of the insulating plate, such as at the edge surface 125 in FIG. 4. The conductive plate 126 abuts the bottom surface 124 of the insulating plate 120.

As more clearly shown in FIG. 4, each terminal 102 is electrically isolated and readily accessible for testing in the bottom cavity 128. As conductive materials contact the insulating plate except along the top surface 121, the conductive materials will, during handling, provide a discharge path for electrostatic charges that otherwise could accumulate on the insulating material and thereby minimize the potential for damage due to electrostatic discharge. Such electrostatic charges can accumulate through the well-known triboelectric effect.

It has been found that the carrier shown in FIGS. 1 through 4 meets all the objectives of the invention and even surpasses them. The carrier limits the accumulation of electrostatic charges due to triboelectric effects to acceptable levels. In some applications it has been found that the limit approaches the limits provided by prior art structures; that only a minimal charge accumulates that poses no danger to the component. The skirts protect the component from damage. The lower cavity presents the terminals for attachment to test leads or probes for preassembly testing.

The carrier shown in FIGS. 1 through 4 is adapted for either or both of two retention schemes for maintaining a component 100 in the carrier 111. In one approach, some or all the apertures 123 are sized to produce an interference fit between the insulating plate 120 and the terminals 102. In a preferred alternative, the cover 112, as a retention means, captures the component 100 in the carrier against the first insulating surface 121. The cover 112 is preferably a snap-in cover, the snapping action being produced when the cover 112 deflects fingers, such as the finger 136, so it overlies and captures the cover 112 adjacent the slots 151 and 152.

As also shown particularly in FIGS. 1 and 2, a plurality of indentations about the periphery of the conductive frame means enable external tooling to engage the frame means for various manipulative purposes. Finally the material of the conductive frame 111 and cover 112 typically comprise a molded conductively filled plastic, whereas the insulating sheet 120 comprises a molded nonconductive plastic. Typically the plastic material is the same for both the conductive and nonconductive portions and can comprise any of a wide variety of easily molded, conductive and thermally and dimensionally stable materials. Polyether sulfones are preferred while polyether imides, polyaeryl sulfones and polyesters are also examples of suitable materials. Aluminum, steel and carbon constitute acceptable fillers.

FLATPACK CIRCUIT CARRIER

Figure 5:
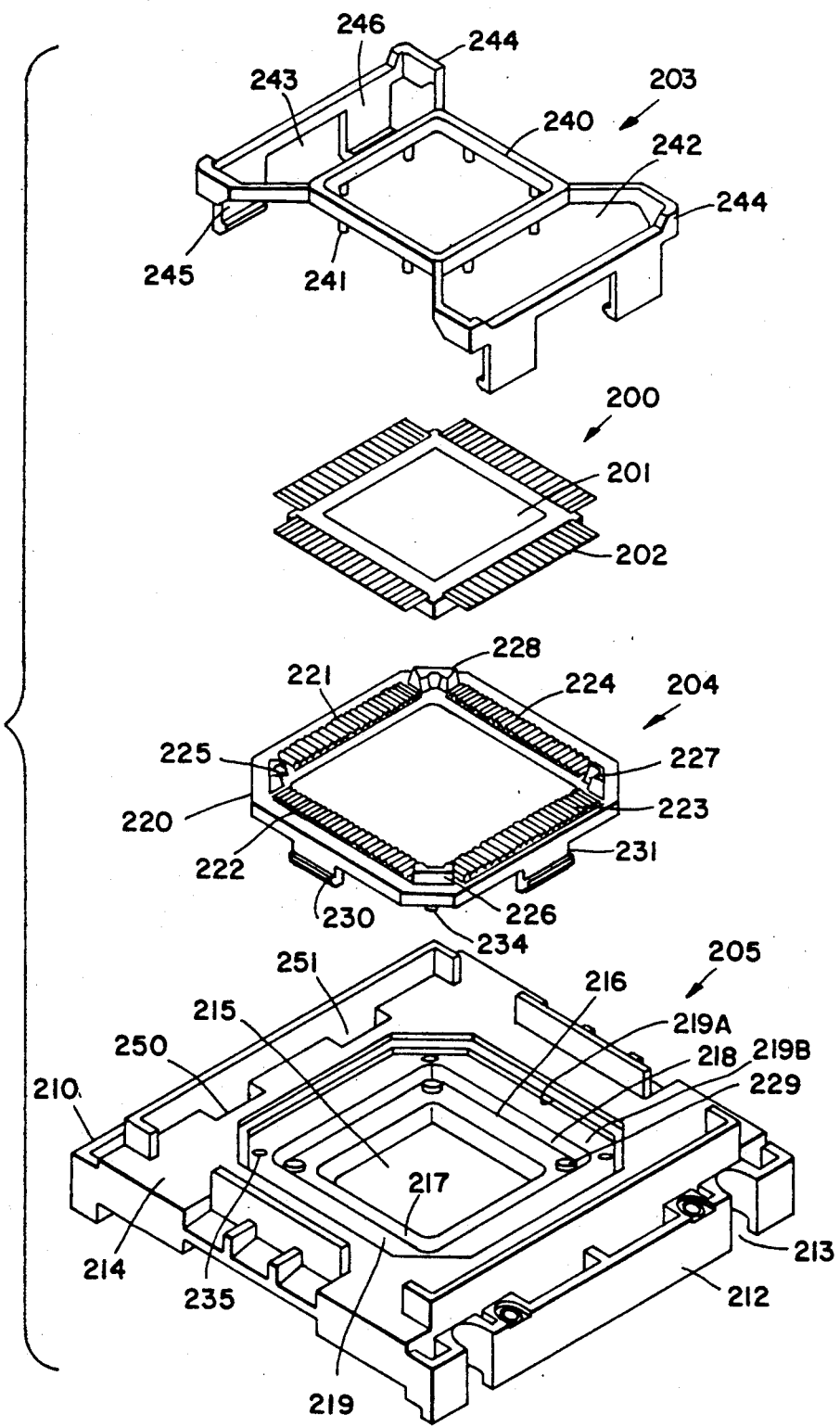
FIG. 5 is an exploded view in perspective of one type of flat pack integrated circuit and a chip carrier constructed in accordance with another aspect of this invention.
Figure 6:
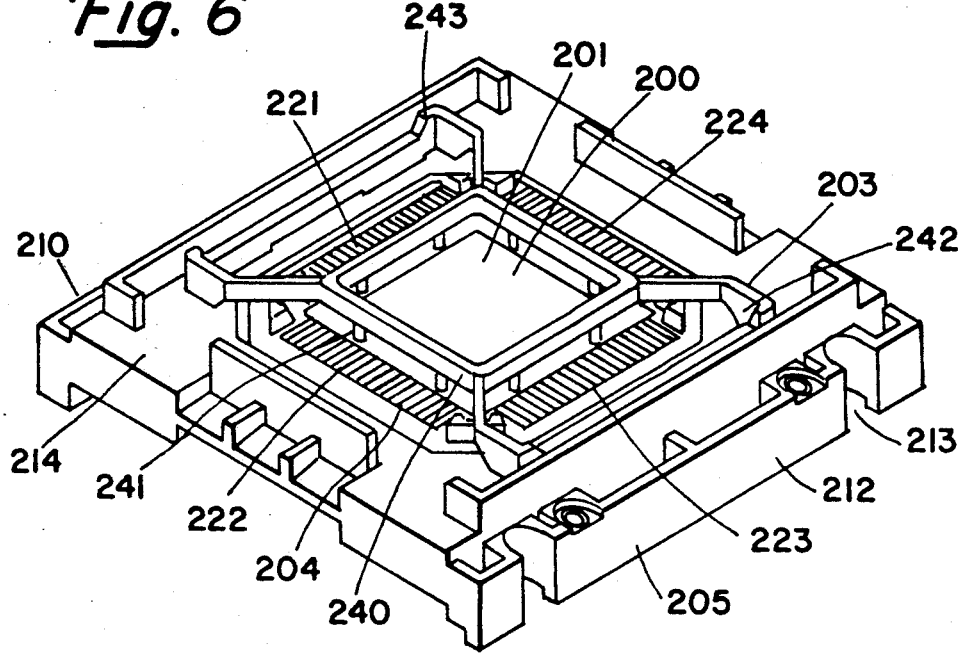
FIG. 6 is a perspective view of the elements of FIG. 5 in assembled form.

FIGS. 5 through 11 depict an embodiment of this invention adapted for use with so-called flatpack components. Referring to FIGS. 5 and 6, a flatpack component 200 typically comprises a ceramic housing 201 and a plurality of terminals 202 extending from the edges thereof. The terminals may be oriented in a horizontal plane as shown in FIGS. 5 and 6 or in a vertical plane.

A carrier embodying this invention adapted for use with flatpacks includes a conductive cover 203, a nonconductive insert 204, and a conductive base or frame 205. The cover 203 and frame 205 may be composed of the same materials as the conductive frame member 110 and cover 112 with respect to FIG. 1. The insulating insert 204 can be composed of the same material as the insulating plate 120 in FIG. 1.

Referring particularly to FIGS. 5 through 7, the conductive frame 205 includes a first side rail 210 with notches 211 and a second side rail 212 with notches 213. The side rails 210 and 212 with their respective notches 211 and 213 provide a means for enabling external tooling to engage and manipulate the conductive frame 205.

The frame additionally includes an internal central body portion 214 between the side rails 210 and 212. The body portion 214 has a square through-hole 215 and a circumscribing lower cavity 216 formed by a step or base 217 and riser 218 around the periphery of the cavity. An upper cavity 219 conforms to the outline and depth of the insulating insert and has a peripheral wall or riser 219A and a step or base 219B.

Referring particularly to FIGS. 5 and 11, the insulating insert 204 includes an open frame 220 dimensioned to nest in the cavity 219 and abut the riser 219B. The interior portion of the open frame 220 has a plurality of comb surfaces 221 through 224, the combed surface 223 being shown in detail in FIG. 11A. Upstanding insulating fingers 223A form surfaces 223B that separate and isolate terminals 202 that extend horizontally from the housing 201 as shown in FIG. 5.

There are two alternatives for supporting a flatpack component in the carrier 205. In accordance with one such alternative, the insulating insert 204 also has four notched structures 225 through 228 at the corners. These corner structures may engage and support the corners of the housing 201 and constitute first surfaces for supporting the component. In accordance with the other alternative, the housing 201 extends through the opening in the frame, 205 to rest on a series of buttons 229. One button 229 extends vertically at each corner of the step 217. These buttons 229 engage the bottom of the ceramic housing 201. Although the buttons 229 are conductive, the circuitry in the housing 201 is isolated from the conductive frame 205 because the ceramic housing 201 constitutes an insulating barrier.

The insert 204 additionally includes a series of depending legs, such legs 230 and 231 shown in FIGS. 5, 10 and 11. These depending legs register with rectangular apertures such as apertures 232 and 233 shown in FIGS. 7, 8, and 10. The legs and apertures provide a snap connection between the insulating insert 204 and the conductive frame 205. A plurality of buttons 234, shown in phantom in FIG. 11, extend downwardly at the corners of the insert 204. They act as locating pins that engage corresponding apertures 235 formed in the bottom surface of the upper cavity 219 on the bottom of the insert 204. The use of the snap-in insert enables a single conductive frame 205 and cover 203 to accept a plurality of flatpack components. For example, it is only necessary to change the insert to receive an appropriate lead structure to adapt the carrier specifically shown in FIGS. 5 through 11 for a flatpack component with vertically oriented leads.

Thus, when the flatpack component 200 is placed on the insert 204 in the conductive frame 205, the corners 225 through 228 constitute first surfaces that engage and support the component housing 201. The comb surfaces, including the areas between fingers such as the finger 223A shown in FIG. 11A, define second surfaces that isolate and support the individual terminals 202 extending from the housing 201. The riser 219A about the periphery of the cavity 219 abuts the insert 204, and the step or base 219B underlies and engages the bottom of the insert 204. As a result, conductive material in the frame 205 positions the insert 204 and overlays the insulating surfaces of the insert 204, other than the surface that supports the component terminals 202.

As shown particularly in FIG. 5, the retention device for this carrier comprises an open cover 203 that includes a central open frame structure 240 with a plurality of depending legs 241 that engage the top of the housing 201. Outrigger sections 242 and 243 each include a frame 244 and a pair of depending arms 245 and 246. These arms engage the conductive frame when they pass through slots 250 and 251 shown in FIGS. 5 and 7. They are formed to snap into the frame 205. As will be apparent from FIG. 6, the cover 203 positively retains the flatpack component 200 in the carrier frame 205. However, the terminals 202, that lie on top of the combs 221 through 224, so they are electrically insulated from each other and from the frame and are readily accessible for testing purposes.

Finally, the various contacts or interfaces between the conductive frame and the insulating insert provide conductive paths for minimizing the accumulation of any electrostatic charge on any insulator.

TRANSISTOR OUTLINE CIRCUIT CARRIERS

Referring to FIGS. 12 through 17, this invention also can be applied to the transportation, handling and testing of integrated circuits in "transistor outline" or "TO" packages. A carrier 300 constructed in accordance with this invention carriers an eight-lead component 301 in a TO package characterized by a cylindrical housing 302 and a plurality of parallel terminals 303. The terminals 303 extend from the housing 302 in a circular or other predetermined pattern coaxially with a vertical axis 304 normal to a centrally disposed axis 305. The axis 304 represents a line along which the component 301 travels as it is being inserted in the carrier 300. The axis 305 extends longitudinally of the carrier 300; typically the carrier 300 travels along the axis 305.

The carrier 300 comprises a conductive frame member 300A and an insulating insert section 300B for supporting the component 301. The conductive frame member 300A has a central planar section 310 with a longitudinal dimension along the axis 305. The carrier 300 also includes side rails 311 and 312 disposed along the opposite edges of the planar section 310 parallel to the axis 305. The side rail 311 includes an upper surface 313 that parallels the upper surface 310. In the orientation shown in FIGS. 12 and 13, the surface 313 lies above the upper surface of the planar section 310. The side rail 311 additionally includes an outer side wall 314 and a bottom wall 315 that is raised above a bottom surface 316 of the planar section 310, as particularly shown in FIGS. 15 through 17. A U-shaped notch 317 in the side rail 311 enables external tooling to engage the side rail 311.

Similarly, the side rail 312 has an upper surface 320 that is co-planar with the surface 313 and that has a longitudinal groove 321. The side rail 312 additionally includes a side wall 322 parallel to the side wall 314, a bottom wall 323 that is co-planar with the bottom wall 315 and two U-shaped notches 324 and 325 spaced along the length of the side rail 312. The groove 321 and notches 324 and 325 also facilitate transportation and manipulation by external tooling during the assembly process.

Referring to FIG. 15, the central planar portion 310 additionally includes a lower cavity 326 and an upper cavity 327 Centered on the axis 304. A cylindrical housing 330 extending from the upper surface of the planar portion 310 and centered on the axis 304 further defines the upper cavity 327. This housing portion 330 and the cavities 326 and 327 support an insert 331 as described more fully later.

As shown in FIGS. 12 through 17, the planar base member 310 and housing 330 center the insert 331 on the axis 304. Manufacture of the carrier 300 includes an initial molding operation that produces the central planar portion 310, side rails 311 and 312 and the housing portion 330. The carrier frame material should be easily molded, conductive and thermally and dimensionally stable through a range of temperatures associated with the handling and transport of components. A normal temperature range is −55° C. through +150° C. Dimensional stability is important for maintaining the overall profile of the carrier in use. Although a wide range of materials are suitable for injection molding this portion of the carrier 300, carbon- and aluminum-filled polyether sulfones are preferred. Polyether imides, polyaeryl sulfones and polyesters filled with the foregoing or other conductive materials also can be used. Thus the planar section 310, side rails 311 and 312 and housing 330 are formed of a rigid, conductive material.

Now referring particularly to FIGS. 15 through 17, the insulating insert 331 comprises a central cylindrical core 332 disposed along the axis 304 that constitutes a first surface for supporting the housing 302. An upper surface 333 that tapers outwardly toward the median portion of the core 332 along the axis 304. A plurality of equiangularly spaced fins 334 radiate from the central core 332 to an outer surface or shell 335 adjacent the housing 330. In this particular embodiment, the insert 331 has eight radial fins 334 extending from the core 332 corresponding to the eight terminals 303 from the TO package 301. A thin horizontal annular web 336 extends from the core 332 at the area of maximum flare diameter of the surface 333 to the fins 334 and shell 335. The fins 334 therefore define a pie-shaped open segments 337 that have openings that are wider at the top than at the web 336. Each of the segments 337, however, is characterized by having an aperture 338 formed through the web 336 such that the array of apertures 338 corresponds to and is in register with an array of terminals 303 from a corresponding TO package 301. The various surfaces of the insert at the fins 334 constitute plural second surfaces that electrically isolate each terminal 303.

Certain of the apertures 338 will have a cylindrical shape dimensioned to provide a slip fit between a terminal 303 and the material in the web 336. Other apertures may have a conical or tapered cross-section with a minimum diameter selected to produce an interference fit between the terminal 303 and the web 336.

After the central planar member 310 with its side rails 311 and 312 and housing 331 are molded, a second molding operation with any of the previously described materials, but absent any conductive filler, produces the insert 331. The resulting insert 331 therefore has more resiliency than the planar section 310. As terminals extend through the apertures 338, those extending through apertures with conical sections are securely held on the insert 331.

As a component 301 moves along the axis 305 shown in FIG. 12 toward the finished carrier 300, the terminals 303 first position themselves in the open segments 336. The radial fins 334, the surface 333 and surface of the shell 335 all coact to guide the ends of the terminals 303 toward the apertures 338. When the terminals 303 pass through the apertures 338, the component can be positioned until the housing 301 rests atop the central core 332 as shown in FIG. 13.

The fins 334 of the insert 331 extend below the planar section 310 without the shell 335. The overall length of the insert 331 along the axis 304 is at least coextensive with the length of the terminals 303. The fins 334 isolate individual terminals 303 and facilitate the placement of test leads or probes to individual terminals for testing purposes.

Thus, in accordance with the objectives of this invention, the carrier 300 shown in FIGS. 12 through 17 securely holds an electronic component in n eight-lead TO package. The resiliency of the insert 331 minimizes any potential for damage to the terminals 303 by eroding any plating or otherwise scoring the terminals 303, yet provides a positive retention function due to the interference fit between the insert 331 and the terminals 303 through the web 336. The insert 331 isolates individual terminals 303 to permit testing during the production process. Finally, the planar section 310 engages the insert about its periphery as a third surface while the housing 330 engages the end surfaces of the fins 334 as fourth surfaces These abutting surfaces produce discharge paths to minimize the accumulation of electrostatic charges that could otherwise accumulate, discharge and destroy the component.

FIGS. 18 through 23 disclose another embodiment of this invention in which a carrier 400 supports a twelve-lead component 401 in a TO package characterized by a rectangular housing 402 and a plurality of terminals 403. The terminals 403 are arrayed along the periphery of a square with three terminals 403 being positioned on each side of the square. The terminals are arrayed parallel to a vertical axis 404 normal to a centrally disposed axis 405. The axis 404 represents a line along which the component 401 travels as it is being inserted in the carrier 400. The axis 405 extends longitudinally of the carrier; typically the carrier 400 travels along the axis 405.

Like the carrier 300 shown in FIGS. 12 through 17, the carrier 400 comprises a conductive frame member 400A and an insulating insert section 400B. The conductive frame member 400A has a central planar section 410 with a longitudinal dimension along the axis 405. The carrier 400 also includes side rails 411 and 412 having the same general construction and configuration as the side rails 311 and 312 described with respect to FIGS. 12 through 17.

Figure 18:
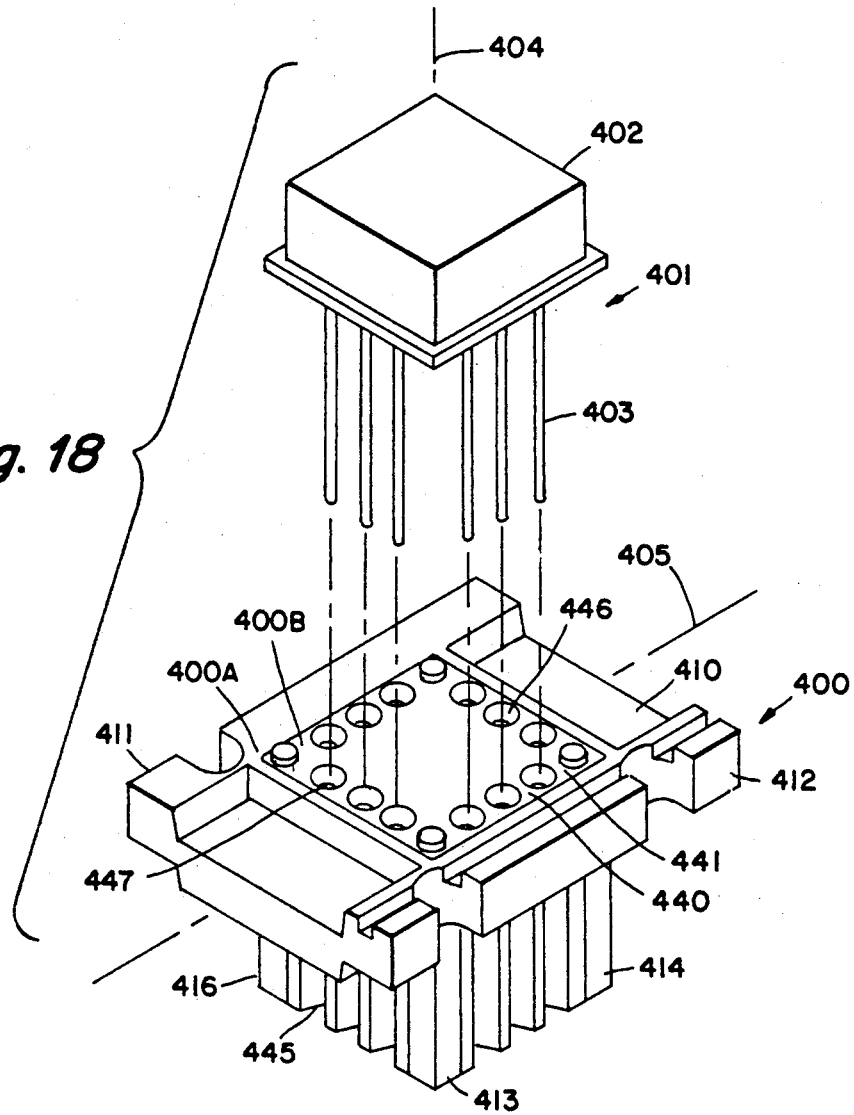
FIG. 18 is an exploded perspective view of a chip carrier constructed in accordance with this invention for use with an alternative transistor outline integrated circuit package.
Figure 19:
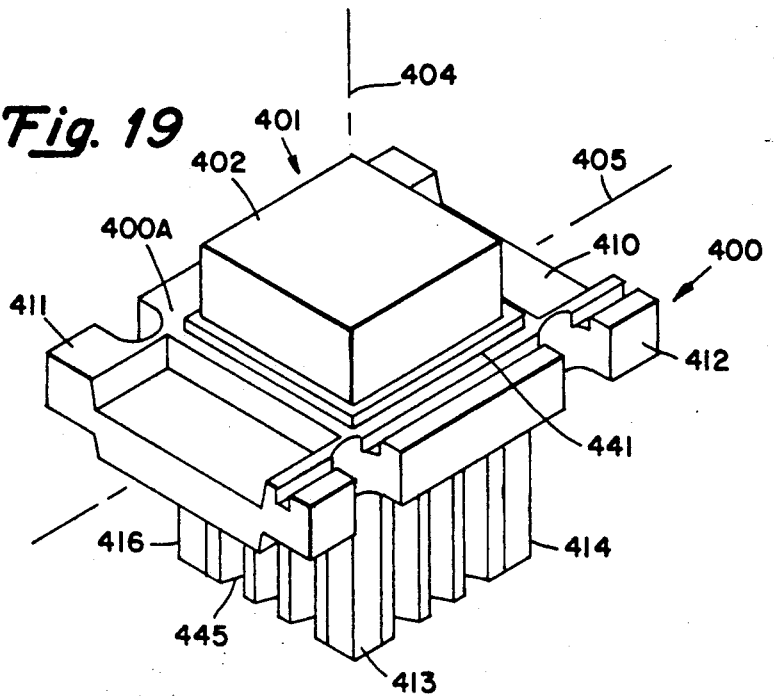
FIG. 19 illustrates the elements of FIG. 18 in an assembled version.
Figure 20:
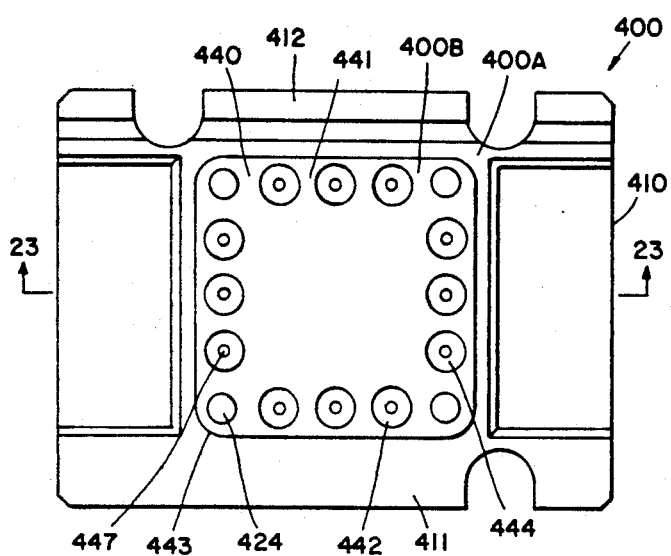
FIG. 20 is a top view of the chip carrier shown in FIGS. 18 and 19.
Figure 21:
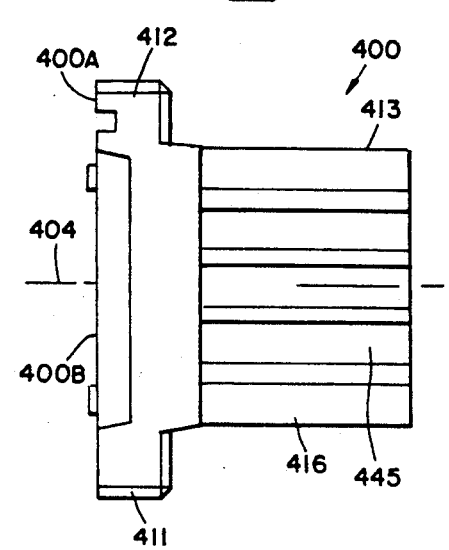
FIG. 21 is a side view of the chip carrier shown in FIGS. 18 and 19.
Figure 22:
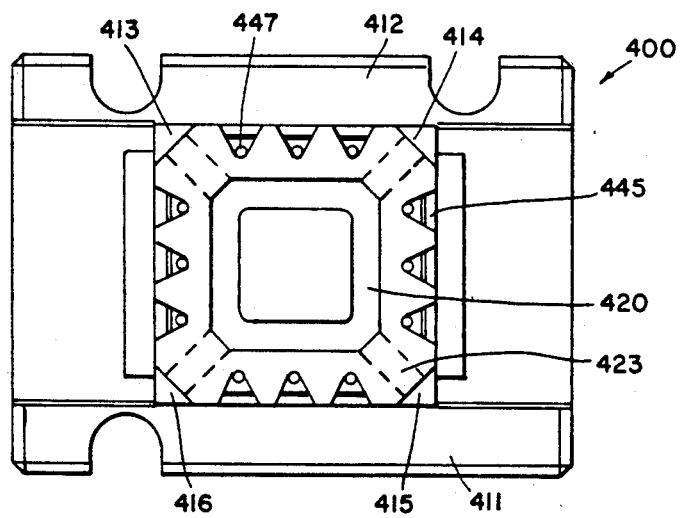
FIG. 22 is a bottom view of the chip carrier shown in FIGS. 18 and 19.
Figure 23:
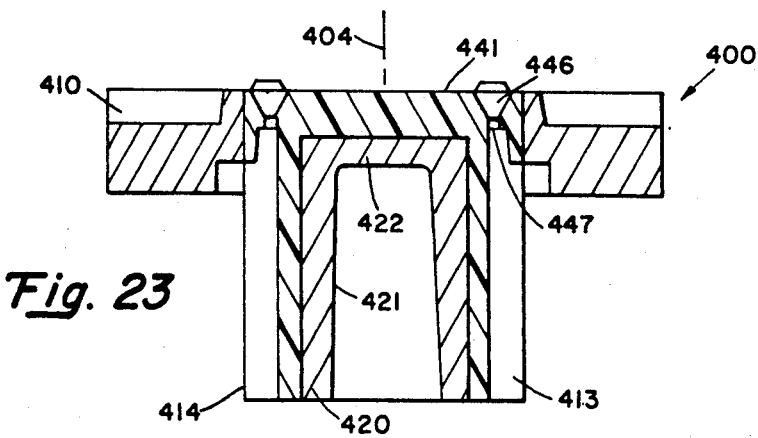
FIG. 23 is a section view taken along lines 23—23 in FIG. 20.

Referring specifically to FIGS. 18, 19, and 22, four legs, designated by reference numerals 413, 414, 415, and 416, each have a triangular cross-section and depend from the bottom surface of the planar section 410. The hypotenuse of each triangular cross-section faces the central axis 404. The four legs 413 through 416 provide rigid conductive corner structures and also support a square, hollow housing 420 shown specifically in FIGS. 22 and 23. As shown most clearly in FIG. 23, the housing 420 has side walls, such as side wall 421, parallel to the axis 404. The housing 420 is open at the bottom; a top portion 422 closes the housing 420. As shown more clearly in FIG. 22, fins 423 radiate from the outer surface of the side walls, such as sidewall 421 at each of the corners of the housing 420, thereby to interconnect with the legs 413 through 416 and the housing 420 thereby to suspend the housing 420 along the axis 404.

As discussed with respect to the carrier 300 in FIGS. 12 through 17, a wide range of materials are suitable for injection molding this portion of the carrier 400. In fact the same materials can be used and, in this embodiment, carbon-, steel or aluminum-filled polyether sulfones are preferred. Thus the planar section 410 with its side rails 411 and 412, the legs 413 through 416, square hollow housing 420 and supporting fins 423 all are formed as a rigid, conductive structure.

The conductive portion has an upper cavity 424 in the top surface of the planar section 410 that contains molding material utilized to produce an insulating insert 440. The insert 440 has a top planar portion 441 with a plurality of apertures 442 formed about a peripheral portion 443 depending portion 444 of the insert 440 includes a plurality of vee-shaped shaped grooves 445 that extend below the apertures 442 such that each aperture 442 aligns essentially with the apex of one groove 445. The array of the apertures 442 and grooves 445 therefor corresponds to the array defined by the terminals 403 in the TO package 401. As specifically shown in FIG. 20, each edge of the top portion 441 has three apertures 442 along each edge.

The grooves 445 face outwardly perpendicular to the walls 421 of the housing 420 to terminate along surfaces coextensive with the outer edges of the various legs 413 through 416. Below the planar section 410 the grooves 445 are open to facilitate the placement of test leads or other apparatus. As shown particularly in FIG. 23, each aperture 442 has an upper conical section 446 that tapers to a through-hole 447. The through-hole 447 may be a clearance hole with a diameter that produces a slip fit with the terminals 403 or a tapered or otherwise sized aperture to produce an interference fit.

The insert 440 can be molded into and about the portions of the planar section 410 and legs 413 through 416 and housing 420 using any of the foregoing materials without any conductive fillers. As was true with the carrier described with respect to FIGS. 12 through 17, the resulting insert 440 has more resiliency than the planar section 410. Thus, as terminals 403 extend through the apertures 442, those extending through any apertures that produce an interference fit are securely held by the insert 440. However, the inherent resiliency of the insulating material minimizes the potential for any damage to the terminals either by eroding any plating or otherwise scoring the terminals 403. As a component 401 moves along the axis 405 shown in FIG. 18 toward the finished carrier 400, the ends of the terminals 403 will first engage themselves in the upper conical sections 446 in the insulating insert 440. The conical portions coact to position all the terminals 403 above the through holes 447. Then the component 401 can be positioned with its housing 402 resting on the top surface of the planar section 441, as shown in FIG. 19.

Thus, in accordance with the objectives of this invention, the carrier 400 shown in FIGS. 18 through 23 also securely holds an electronic component in a twelve-lead TO package. The top planar portion 441 supports the housing 402. The surfaces at the grooves 445 isolate the terminals 403, and testing equipment can readily access the terminals 403 below the central planar section 410. The planar section 410 engages or abuts the top portion of the insert and the legs 413 to 416 abut the corners of the insert 440 to minimize the accumulation of any electrostatic charge.

This invention has been disclosed in terms of certain embodiments. It will be apparent that many modifications can be made to the disclosed apparatus without departing from the invention Therefore, it is the intent of the appended claims to cover all such variations and modifications as come within the true spirit and scope of this invention.

What is claimed as new and desired to be secured by Letters Patent of the U.S. is:

1. A carrier for facilitating the handling by external means of an electronic component having a housing and terminals extending therefrom in a predetermined configuration, said carrier comprising:
   A. insulating means for positioning the component in said carrier and electrically isolating the leads therefrom including a first surface for engaging the housing, plural second surfaces for supporting each terminal in electrical isolation and third and fourth surfaces, and
   B. conductive frame means including boundary means circumscribing said insulating means for engagement by the external means and abutting a said third surface of said insulating means and conductive means for abutting said fourth surface whereby said conductive frame means substantially dissipates any electrical charge that otherwise would tend to accumulate on said insulating means.

2. A carrier as recited in claim 1 wherein said carrier additionally comprises retention means for capturing the component in the carrier against said first insulating surface.

3. A carrier as recited in claim 1 wherein said carrier is adapted for travel along a motion axis under the control of the external means and said conductive frame means includes means transverse to the axis for dissipating any mechanical shock imparted to said carrier.

4. A carrier as recited in claim 1 wherein said conductive frame means and insulating means are each composed of a molded, high temperature, plastic material, said conductive frame means material additionally including conductive filler material.

5. A carrier as recited in claim 4 wherein said plastic material is taken from the group consisting of polyether sulfone, polyether imides, polyaeryl sulfones and polyesters and said conductive filler is taken from the group of aluminum, steel and carbon.

6. A carrier as recited in claim 1 wherein the electronic component is a pin grid array component with a planar housing and a plurality of depending terminals parallel to a transverse axis through the housing, wherein said boundary means comprises an open rectangular frame and said conductive means comprises a planar conductive sheet spanning said open rectangular frame and wherein said insulating means comprises a planar sheet abutting said planar conductive sheet, said boundary means abutting said insulating means edges that constitute said third surfaces and said first surface supporting the component housing.

7. A carrier as recited in claim 6 wherein said insulating means is composed of a high temperature moldable insulating material taken from the group consisting of polyether sulfones, polyether imides, polyaeryl sulfones and polyesters and said conductive frame means is composed of a material taken from the group consisting of polyether sulfones, polyether imides, polyaeryl sulfones and polyesters having a filler from the group consisting of carbon, steel and aluminum.

8. A carrier as recited in claim 6 wherein said carrier additionally comprises an array of apertures formed parallel to the transverse axis and through said insulating means and said conductive means, each of said apertures having a predetermined diameter in said insulating means corresponding to the diameter of the terminals and a greater diameter through said conductive means.

9. A carrier as recited in claim 8 wherein said carrier is adapted for travel along a motion axis under the control of the external means and said conductive frame means includes means transverse to the axis for dissipating any mechanical shock imparted to said carrier.

10. A carrier as recited in claim 9 additionally comprising a cover means having a first portion for contacting said housing and second portions for engaging said boundary means thereby to capture a component in said carrier.

11. A carrier as recited in claim 10 wherein said carrier has engagement means formed at the boundary means, said engagement means on said cover means and said conductive frame means coacting to releasably connect said cover means to said conductive frame means.

12. A carrier as recited in claim 11 wherein said insulating means is composed of a high temperature moldable insulating material taken from the group consisting of polyether sulfones, polyether imides, polyaeryl sulfones and polyesters and said conductive frame means is composed of a material taken from the group consisting of polyether sulfones, polyether imides, polyaeryl sulfones and polyesters having a filler from the group consisting of carbon, steel and aluminum.

13. A carrier as recited in claim 1 wherein the electronic component is a flatpack component with a planar housing and a plurality of terminals extending from the edges of said housing, wherein said boundary means comprises side rail means and said conductive means comprises a conductive member extending between said side rail means having a centrally disposed seat formed therein and wherein said insulating means comprises a planar insulating insert disposed in said seat of said conductive means, said boundary means and said conductive means abutting said insulating insert, and said insulating insert having an upper surface for engaging the terminals of said component and internal transverse surface means for positioning the component housing.

14. A carrier as recited in claim 13 wherein said insulating means is composed of a high temperature moldable insulating material taken from the group consisting of polyether sulfones, polyether imides, polyaeryl sulfones and polyesters and said conductive frame means is composed of a material taken from the group consisting of polyether sulfones, polyether imides, polyaeryl sulfones and polyesters having a filler from the group consisting of carbon, steel and aluminum.

15. A carrier as recited in claim 13 wherein said carrier additionally comprises a cover means having a central frame and depending legs for engaging the housing and second portions for engaging said boundary means thereby to capture a component in said carrier.

16. A carrier as recited in claim 15 wherein carrier has engagement means formed at the boundary means, said engagement means on said cover means and said conductive frame means coacting to releasably connect said cover means to said conductive frame means.

17. A carrier as recited in claim 16 wherein said insulating means is composed of a high temperature moldable insulating material taken from the group consisting of polyether sulfones, polyether imides, polyaeryl sulfones and polyesters and said conductive frame means is composed of a material taken from the group consisting of polyether sulfones, polyether imides, polyaeryl sulfones and polyesters having a filler from the group consisting of carbon, steel and aluminum.

18. A carrier as recited in claim 1 wherein the component has the form of a transistor outline package with a cylindrical housing extending a longitudinal axis with leads parallel to the longitudinal axis extending from one end thereof, wherein said conductive boundary means comprises a plurality of parallel spaced side rail means for engagement by the external means and a planar frame means disposed between said side rail means including a first portion thereof for engaging said insulating means, said insulating means being disposed along an axis transverse to said planar frame means and being engaged along a portion of the circumference thereby and extending beyond said planar frame means along the longitudinal axis, said conductive means engaging portions of said insulating means extending beyond said planar frame means and said insulating means having a plurality of separate passages therethrough for individually isolating the terminals from the component, said passages lying along axes parallel to the longitudinal axis.

19. A carrier as recited in claim 18 wherein the electronic component terminals are arranged in a circular array, said insulating means first having a central core member with an end surface engaging the housing of the component, a plurality of ribs extending radially from said central core portion for defining the said second surfaces for supporting each terminal in electrical isolation, said planar frame portion engaging a portion of the periphery of said insert as a third surface thereof and additionally including a cylindrical extension thereon for engaging the edges of said radial ribs on one side of said planar frame means.

20. A carrier as recited in claim 19 wherein said central core portion has a radially extending web interconnecting the inner and outer portions thereof and a plurality of apertures formed through said web to allow the terminals from the component to pass therethrough.

21. A carrier as recited in claim 20 wherein said insulating means is composed of a high temperature moldable insulating material taken from the group consisting of polyether sulfones, polyether imides, polyaeryl sulfones and polyesters and said conductive frame means is composed of a material taken from the group consisting of polyether sulfones, polyether imides, polyaeryl sulfones and polyesters having a filler from the group consisting of carbon, steel and aluminum.

22. A carrier as recited in claim 18 wherein the terminals from said component lie in a rectangular array, said insulating means having a corresponding rectangular cross section and a plurality of apertures therethrough, a first end portion of said rectangular insulating means supporting the housing of the component, the surfaces at said apertures engaging and electrically isolating the terminals from the component, and said carrier frame as a rectangular seat with edges that engage edges of said insulating insert and like corners depending from said frame for engaging the corners of said insulating insert extending below said planar frame means.

23. A carrier as recited in claim 22 wherein said insulating insert has a plurality of grooves formed therein coextensive with the portion of the insulating insert covered by said depending legs, each said groove being in register with one of said apertures thereby to support said terminals in electrical isolation for access by testing equipment.

24. A carrier as recited in claim 23 wherein said insulating means is composed of a high temperature moldable insulating material taken from the group consisting of polyether sulfones, polyether imides, polyaeryl sulfones and polyesters and said conductive frame means is composed of a material taken from the group consisting of polyether sulfones, polyether imides, polyaeryl sulfones and polyesters having a filler from the group consisting of carbon, steel and aluminum.

* * * * *